(12) United States Patent
Kishizawa et al.

(10) Patent No.: US 12,022,734 B2
(45) Date of Patent: Jun. 25, 2024

(54) THERMOELECTRIC MODULE AND ADJUSTMENT METHOD OF THERMOELECTRIC MODULE

(71) Applicant: KELK Ltd., Kanagawa (JP)

(72) Inventors: Toshihiko Kishizawa, Kanagawa (JP); Shinichi Fujimoto, Kanagawa (JP)

(73) Assignee: KELK Ltd., Kanagawa (JP)

(*) Notice: Subject to any disclaimer, the term of this patent is extended or adjusted under 35 U.S.C. 154(b) by 0 days.

(21) Appl. No.: 17/288,979

(22) PCT Filed: Nov. 15, 2019

(86) PCT No.: PCT/JP2019/044977
§ 371 (c)(1),
(2) Date: Apr. 27, 2021

(87) PCT Pub. No.: WO2020/137244
PCT Pub. Date: Jul. 2, 2020

(65) Prior Publication Data
US 2021/0391524 A1    Dec. 16, 2021

(30) Foreign Application Priority Data

Dec. 27, 2018  (JP) ................. 2018-245551

(51) Int. Cl.
*H10N 10/17*  (2023.01)
*H10N 10/01*  (2023.01)
*H10N 10/82*  (2023.01)

(52) U.S. Cl.
CPC ............ *H10N 10/01* (2023.02); *H10N 10/17* (2023.02); *H10N 10/82* (2023.02)

(58) Field of Classification Search
CPC ......... H01L 35/28; H01L 35/30; H01L 35/32; H01L 35/02; H01L 35/04; H01L 35/10; H10N 10/17; H10N 10/82; H10N 19/00
See application file for complete search history.

(56) References Cited

U.S. PATENT DOCUMENTS

| | | | |
|---|---|---|---|
| 6,388,186 B1 * | 5/2002 | Nomura | H10N 10/17 136/224 |
| 10,355,189 B2 | 7/2019 | Lee et al. | |
| 2005/0161072 A1 * | 7/2005 | Esser | H10N 10/17 136/211 |

(Continued)

FOREIGN PATENT DOCUMENTS

| | | |
|---|---|---|
| CN | 1532955 A | 9/2004 |
| JP | 03181185 | 8/1991 |

(Continued)

OTHER PUBLICATIONS

PCT International Search Report in International Application No. PCT/JP2019/044977, dated Jan. 28, 2020, 3 pages.

(Continued)

*Primary Examiner* — Andrew J Golden
(74) *Attorney, Agent, or Firm* — Fish & Richardson P.C.

(57) ABSTRACT

A thermoelectric module includes a substrate, a plurality of electrodes arranged on a surface of the substrate, a plurality of thermoelectric elements respectively connected to the plurality of electrodes, and at least three terminals respectively connected to the different electrodes and connected to one or both of a first load and a second load.

11 Claims, 12 Drawing Sheets

(56) References Cited

U.S. PATENT DOCUMENTS

| | | | |
|---|---|---|---|
| 2007/0095378 A1 | 5/2007 | Ito et al. | |
| 2008/0092939 A1* | 4/2008 | Kondoh | H01L 35/30 136/205 |
| 2008/0115818 A1* | 5/2008 | Cheng | H10N 10/17 136/205 |
| 2008/0314430 A1* | 12/2008 | Ghoshal | H01L 35/00 136/203 |
| 2011/0036384 A1* | 2/2011 | Culp | H01L 35/32 136/201 |
| 2012/0194005 A1* | 8/2012 | Liu | H02J 3/46 307/151 |
| 2013/0239591 A1 | 9/2013 | Clarkson | |
| 2015/0288187 A1* | 10/2015 | Poitrast | H01L 35/32 700/295 |
| 2017/0365761 A1* | 12/2017 | Lee | H01L 35/32 |
| 2017/0373238 A1* | 12/2017 | Makino | H01L 35/32 |

FOREIGN PATENT DOCUMENTS

| | | |
|---|---|---|
| JP | 2004-235525 A | 8/2004 |
| JP | 2005251950 | 9/2005 |
| JP | 2007150231 | 6/2007 |
| JP | 2005117835 | 4/2015 |
| JP | 2016015861 | 1/2016 |
| JP | 2016164947 | 9/2016 |
| JP | 2017-152618 A | 8/2017 |
| WO | WO-2016147918 A1 * | 9/2016 ............. H01L 35/32 |
| WO | WO2018174173 | 9/2018 |

OTHER PUBLICATIONS

Office Action in Chinese Appln. No. 201980077198.4, dated Nov. 23, 2023, 15 pages (with machine translation).

* cited by examiner

[VOLTAGE OF FAN–AIR VOLUME CHARACTERISTIC]

[AIR VOLUME OF HEAT RADIATING MEMBER–THERMAL RESISTANCE CHARACTERISTIC]

[VOLTAGE–THERMAL RESISTANCE CHARACTERISTIC]

THERMOELECTRIC MODULE AND ADJUSTMENT METHOD OF THERMOELECTRIC MODULE

CROSS-REFERENCE TO RELATED APPLICATIONS

This application is a National Stage application of International Application No. PCT/JP2019/044977, filed on Nov. 15, 2019, which claims priority to Japanese Patent Application No. 2018-245551, filed on Dec. 27, 2018. The contents of the prior applications are incorporated herein in their entirety.

FIELD

The present invention relates to a thermoelectric module and an adjustment method of the thermoelectric module.

BACKGROUND

A thermoelectric module that converts thermal energy into electrical energy by the Seebeck effect is known.

CITATION LIST

Patent Literature

Patent Literature 1: Japanese Laid-Open Patent Application No. 2016-164947

SUMMARY

Technical Problem

There is a case where electrical energy generated from a thermoelectric module is distributed to a first load and a second load. For example, in a case where a motor to rotate a fan that cools a thermoelectric module is provided, there is a case where a part of electrical energy generated from the thermoelectric module is supplied to the motor and surplus electrical energy is supplied to an external load. When the electrical energy supplied to the motor is large, the electrical energy supplied to the external load is decreased. When the electrical energy supplied to the motor is small, the thermoelectric module is not sufficiently cooled, and the electrical energy generated from the thermoelectric module is decreased.

An aspect of the present invention is to efficiently supply electrical energy generated from a thermoelectric module to each of a first load and a second load in a case where the electrical energy is distributed to the first load and the second load.

Solution to Problem

According to an aspect of the present invention, a thermoelectric module comprises: a substrate; a plurality of electrodes arranged on a surface of the substrate; a plurality of thermoelectric elements respectively connected to the plurality of electrodes; and at least three terminals respectively connected to the different electrodes and connected to one or both of a first load and a second load.

Advantageous Effects of Invention

According to an aspect of the present invention, in a case where electrical energy generated from a thermoelectric module is distributed to a first load and a second load, the electrical energy can be efficiently supplied to each of the first load and the second load.

DESCRIPTION OF EMBODIMENTS

In the following, embodiments according to the present invention will be described with reference to the drawings. However, the present invention is not limited to this. Components of the embodiments described in the following can be arbitrarily combined. Also, there is a case where a part of the components is not used.

In the following description, an XYZ Cartesian coordinate system is set, and a positional relationship of each part will be described with reference to this XYZ Cartesian coordinate system. It is assumed that a direction parallel to an X-axis in a predetermined plane is an X-axis direction (first axis direction), a direction parallel to a Y-axis orthogonal to the X-axis in the predetermined plane is a Y-axis direction (second axis direction), and the predetermined surface, and a direction parallel to a Z-axis orthogonal to the predetermined plane is a Z-axis direction (third-axis direction). The X-axis direction, the Y-axis direction, and the Z-axis direction are orthogonal to each other. An XY plane including the X-axis and Y-axis is parallel to the predetermined plane. A YZ plane including the Y-axis and the Z-axis is orthogonal to the XY plane. An XZ plane including the X-axis and the Z-axis is orthogonal to each of the XY plane and YZ plane.

First Embodiment

<Thermoelectric Device>

Figure 1:
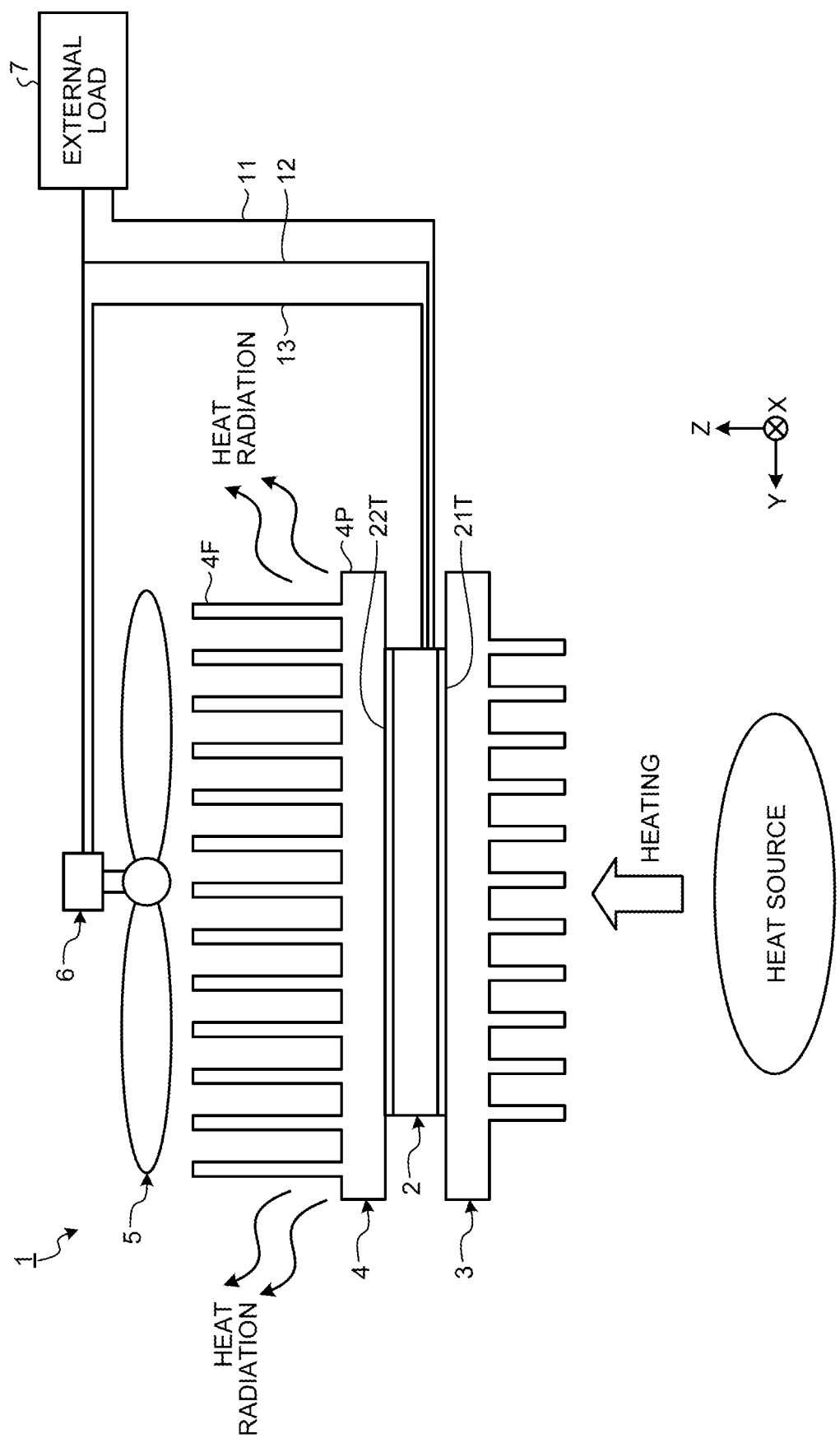
FIG. 1 is a schematic diagram illustrating an example of a thermoelectric device according to a first embodiment.

FIG. 1 is a schematic diagram illustrating an example of a thermoelectric device 1 according to the present embodiment. The thermoelectric device 1 includes a thermoelectric module 2, a heat absorbing member 3 connected to an end surface 21T on a −Z side of the thermoelectric module 2, a heat radiating member 4 connected to an end surface 22T on a +Z side of the thermoelectric module 2, a fan 5 arranged on the +Z side of the heat radiating member 4, and a second load 6 that generates power to rotate the fan 5.

The thermoelectric module 2 generates electrical energy by using the Seebeck effect. The thermoelectric module 2 generates electrical energy when the end surface 21T on the −Z side of the thermoelectric module 2 is heated and the end surface 22T on the +Z side of the thermoelectric module 2 is cooled.

Figure 2:
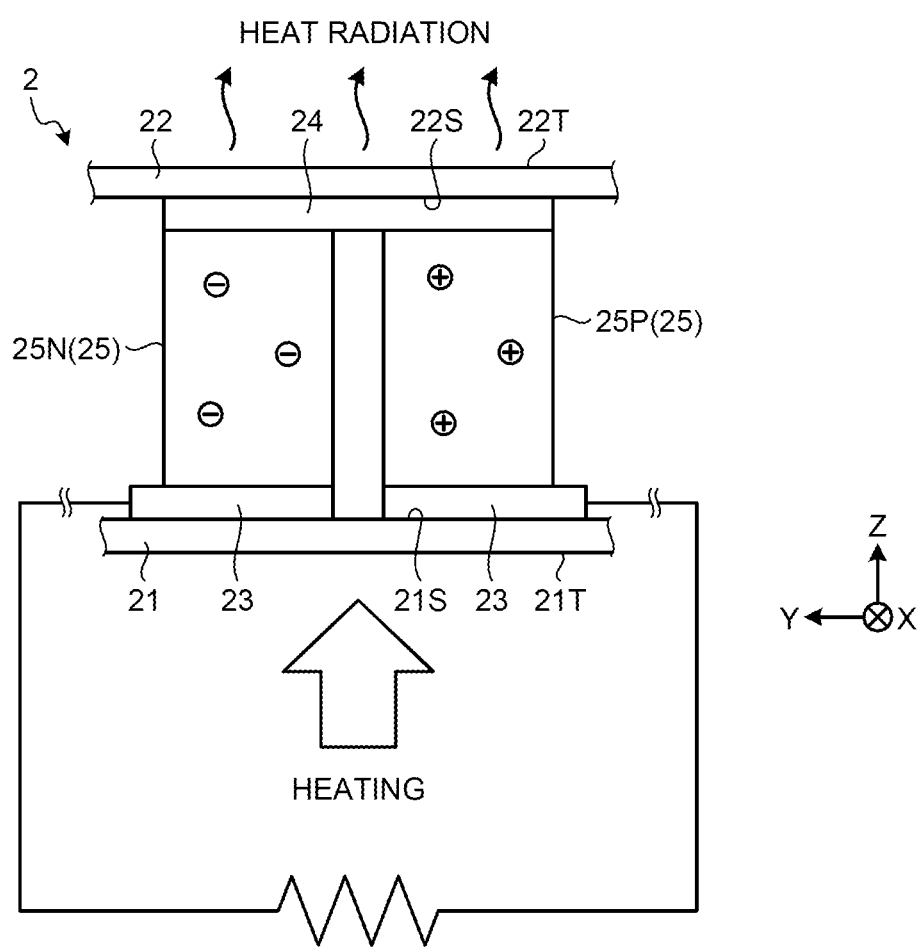
FIG. 2 is a schematic diagram illustrating a thermoelectric module according to the first embodiment.

FIG. 2 is a schematic diagram illustrating the thermoelectric module 2 according to the present embodiment. The thermoelectric module 2 includes a first substrate 21, a second substrate 22, a plurality of electrodes 23 arranged on a surface 21S of the first substrate 21, a plurality of electrodes 24 arranged on a surface 22S of the second substrate 22, and a plurality of thermoelectric elements 25 respectively connected to the plurality of electrodes 23 and the plurality of electrodes 24.

Each of the first substrate 21 and the second substrate 22 is formed of an electrical insulating material such as ceramics or polyimide. The first substrate 21 is arranged on the −Z side of the thermoelectric elements 25. The second substrate 22 is arranged on the +Z side of the thermoelectric elements 25. The first substrate 21 has a surface 21S facing the +Z side and an end surface 21T facing the −Z side. Each of the surface 21S and the end surface 21T of the first substrate 21 is parallel to the XY plane. The second substrate 22 has a surface 22S facing the −Z side and an end surface 22T facing the +Z side. Each of the surface 22S and the end surface 22T of the second substrate 22 is parallel to the XY plane. The end surface 21T of the first substrate 21 includes the end surface 21T of the thermoelectric module 2. The end surface 22T of the second substrate 22 includes the end surface 22T of the thermoelectric module 2.

The plurality of electrodes 23 is arranged in a matrix on the surface 21S of the first substrate 21. The plurality of electrodes 24 is arranged in a matrix on the surface 22S of the second substrate 22.

The thermoelectric elements 25 include, for example, a BiTe-based thermoelectric material. The thermoelectric elements 25 include an n-type thermoelectric semiconductor element 25N and a p-type thermoelectric semiconductor element 25P. The n-type thermoelectric semiconductor element 25N and the p-type thermoelectric semiconductor element 25P are alternately arranged in the XY plane. The electrodes 23 are respectively connected to an end surface on the −Z side of the n-type thermoelectric semiconductor element 25N and an end surface on the −Z side of the p-type thermoelectric semiconductor element 25P. The electrodes 24 are respectively connected to an end surface on the +Z side of the n-type thermoelectric semiconductor element 25N and an end surface on the +Z side of the p-type thermoelectric semiconductor element 25P.

When the first substrate 21 is heated and the second substrate 22 is cooled, a temperature difference is given between the end surface on the −Z side and the end surface on the +Z side of each of the n-type thermoelectric semiconductor element 25N and the p-type thermoelectric semiconductor element 25P. When the temperature difference is given between the end surface on the −Z side and the end surface on the +Z side of the n-type thermoelectric semiconductor element 25N, electrons move from the end surface on the −Z side toward the end surface on the +Z side in the n-type thermoelectric semiconductor element 25N. When the temperature difference is given between the end surface on the −Z side and the end surface on the +Z side of the p-type thermoelectric semiconductor element 25P, holes move from the end surface on the −Z side toward the end surface on the +Z side in the p-type thermoelectric semiconductor element 25P. The n-type thermoelectric semiconductor element 25N and the p-type thermoelectric semiconductor element 25P are connected in series via the electrodes 23 and the electrodes 24. The electrons and holes generate a potential difference between the electrodes 23 and the electrodes 24. The thermoelectric module 2 generates electrical energy due to the generation of the potential difference between the electrodes 23 and the electrodes 24.

The heat absorbing member 3 receives heat from a heat source and performs transmission thereof to the thermoelectric module 2. The heat absorbing member 3 is formed of a metal material such as aluminum or copper. The heat absorbing member 3 is connected to the end surface 21T of the thermoelectric module 2.

The heat radiating member 4 takes heat from the thermoelectric module 2. The heat radiating member 4 is formed of a metal material such as aluminum. The heat radiating member 4 is arranged between the thermoelectric module 2 and the fan 5 in the Z-axis direction.

The heat radiating member 4 includes a heatsink. The heat radiating member 4 has a heat radiating plate 4P connected to the end surface 22T of the thermoelectric module 2, and a fin 4F supported by the heat radiating plate 4P. The pin 4F is a pin fin. Note that the fin 4F may be a plate fin.

The fan 5 rotates to circulate air around the heat radiating member 4 and cool the end surface 22T of the thermoelectric module 2. The fan 5 is arranged on the +Z side of the thermoelectric module 2 and the heat radiating member 4. By the rotation of the fan 5, the heat radiating member 4 and the second substrate 22 are cooled.

The motor 6 generates power to rotate the fan 5. The fan 5 is rotated when the motor 6 is driven. By the rotation of the fan 5, air circulates around the heat radiating member 4, and heat radiation by the heat radiating member 4 is promoted. The second substrate 22 is cooled by the heat radiation by the heat radiating member 4.

The electrical energy generated from the thermoelectric module 2 is distributed to a first load and a second load. In the present embodiment, the first load is an external load 7 provided outside the thermoelectric device 1. The second load is the motor 6. The motor 6 is driven by the electrical energy generated from the thermoelectric module 2. The thermoelectric device 1 is an autonomous thermoelectric device that drives the motor 6 provided in the thermoelectric device 1 by the electrical energy generated from the thermoelectric module 2.

In the following description, the external load 7 is arbitrarily referred to as the first load 7, and the motor 6 is arbitrarily referred to as the second load 6.

<Terminal>

Figure 3:
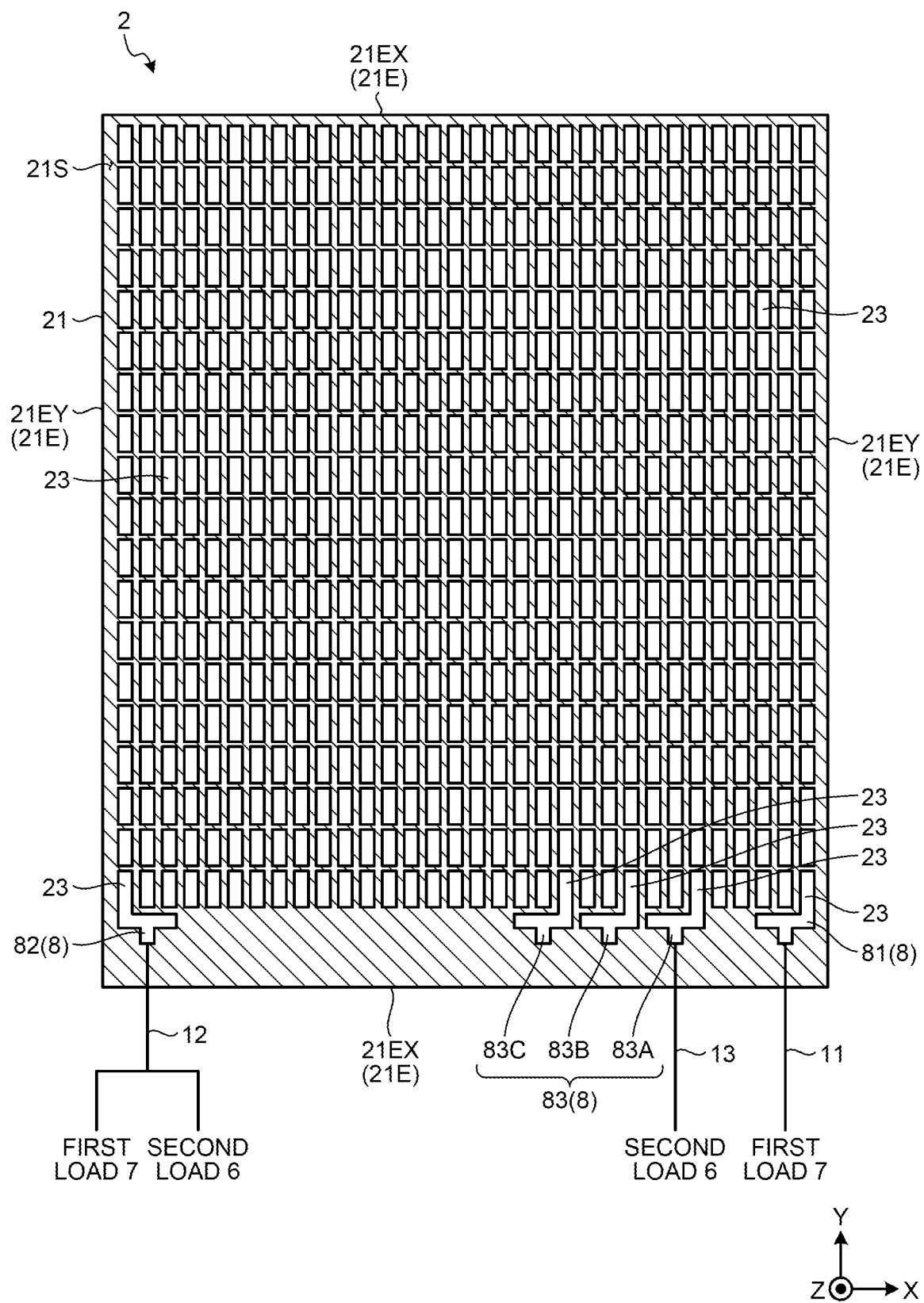
FIG. 3 is a plan view illustrating an example of a first substrate according to the first embodiment.

FIG. 3 is a plan view illustrating an example of a first substrate 21 according to the present embodiment. As illustrated in FIG. 3, a thermoelectric module 2 includes a first substrate 21, and a plurality of electrodes 23 arranged on a surface 21S of the first substrate 21. A thermoelectric element 25 is connected to each of the plurality of electrodes 23. The plurality of electrodes 23 is connected in series via the plurality of thermoelectric elements 25.

In the XY plane, an outer shape of the first substrate 21 is a quadrangle. The first substrate 21 has four edge portions 21E. The edge portions 21E include a pair of first edge portions 21EX extending in the X-axis direction, and a pair of second edge portions 21EY extending in the Y-axis direction.

In the XY plane, an outer shape of each electrode 23 is a quadrangle. Shapes and sizes of the plurality of electrodes 23 are equal. The plurality of electrodes 23 is arranged in a matrix on the surface 21S of the first substrate 21. The electrodes 23 are arranged at regular intervals in each of the X-axis direction and the Y-axis direction.

The thermoelectric module 2 includes at least three terminals 8 respectively connected to the different electrodes 23 and connected to one or both of the first load 7 and the second load 6. The terminals 8 are arranged between the electrodes 23 and the edge portions 21E of the first substrate 21 on the surface 21S of the first substrate 21. In the present embodiment, the terminals 8 are arranged between an electrode 23 on the most −Y side among the plurality of electrodes 23 arranged in the Y-axis direction and a first edge portion 21EX of the first substrate 21 on the −Y side.

In the present embodiment, the terminals 8 include a first terminal 81 connected to the first load 7, a second terminal 82 connected to each of the first load 7 and the second load 6, and a third terminal 83 connected to the second load 6.

The first terminal 81, the second terminal 82, and the third terminal 83 are arranged in the X-axis direction between the electrodes 23 and the first edge portions 21EX.

The first terminal 81 is connected to an electrode 23 on the most +X side among the plurality of electrodes 23 arranged in the X-axis direction. The second terminal 82 is connected to an electrode 23 on the most −X side among the plurality of electrodes 23 arranged in the X-axis direction. The third terminal 83 is arranged between the first terminal 81 and the second terminal 82 in the X-axis direction. That is, the third terminal 83 is connected to an electrode 23 between the electrode 23 to which the first terminal 81 is connected and the electrode 23 to which the second terminal 82 is connected.

Figure 4:
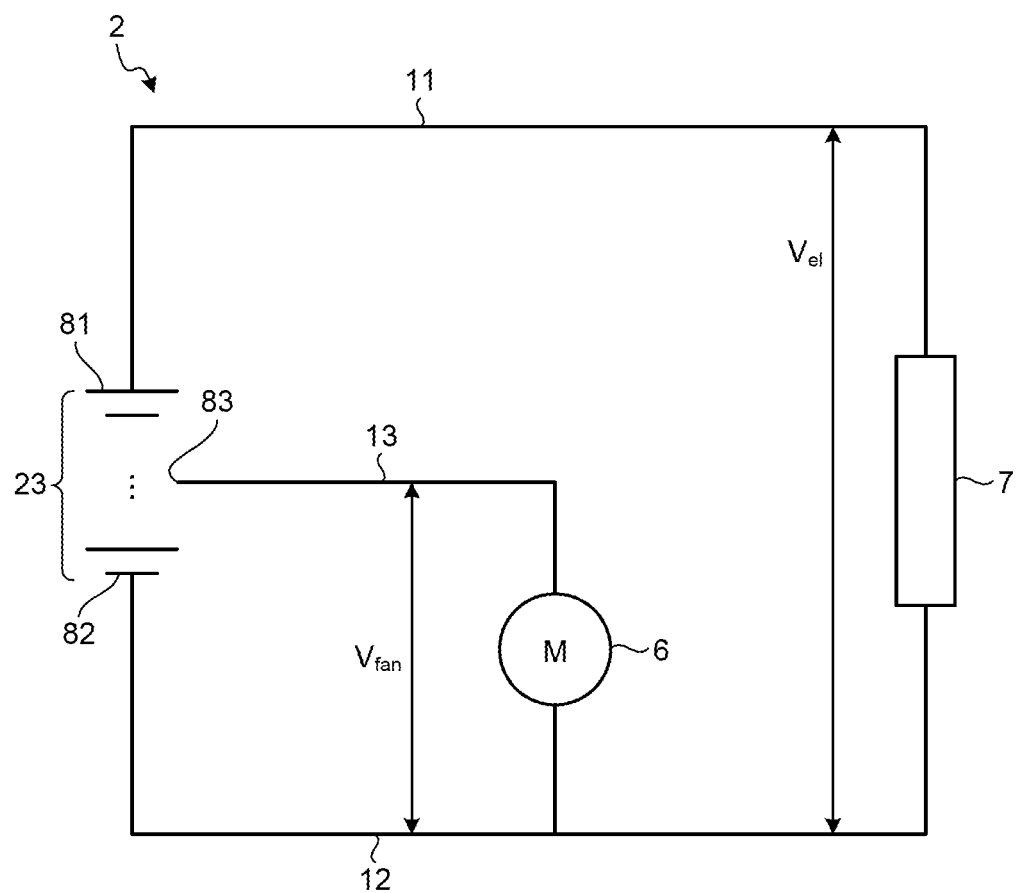
FIG. 4 is a schematic diagram illustrating a connection form between terminals and a first load and a second load according to the first embodiment.

FIG. 4 is a schematic diagram illustrating a connection form between the terminals 8 and the first load 7 and the second load 6 according to the present embodiment. As illustrated in FIG. 3 and FIG. 4, the first terminal 81 is a positive terminal. The second terminal 82 is a negative terminal. The third terminal 83 is a positive terminal. The first terminal 81 is connected to the first load 7 via a lead wire 11. The first terminal 81 is not connected to the second load 6. The second terminal 82 is connected to both of the first load 7 and the second load 6 via a lead wire 12. The third terminal 83 is connected to the second load 6 via a lead wire 13. The third terminal 83 is not connected to the first load 7. A voltage $V_{el}$ between the first terminal 81 and the second terminal 82 is higher than a voltage $V_{fan}$ between the second terminal 82 and the third terminal 83. The voltage $V_{el}$ is a voltage applied to the first load 7. The voltage $V_{fan}$ is a voltage applied to the second load 6.

As illustrated in FIG. 3, the third terminal 83 includes a plurality of third terminals 83A, 83B, and 83C respectively connected to the different electrodes 23. Among three electrodes 23 connected to the third terminals 83A, 83B, and 83C, an electrode 23 connected to the third terminal 83A is the farthest from the electrode 23 connected to the second terminal 82, and an electrode 23 connected to the third terminal 83C is the closest to the electrode 23 connected to the second terminal 82. The voltage $V_{fan}$ is adjusted by selection of a third terminal 83 connected to the lead wire 13 from the plurality of third terminals 83A, 83B, and 83C. When the lead wire 13 is connected to the third terminal 83A, the voltage $V_{fan}$ is adjusted to a high voltage. When the lead wire 13 is connected to the third terminal 83C, the voltage $V_{fan}$ is adjusted to a low voltage. When the lead wire 13 is connected to the third terminal 83B, the voltage $V_{fan}$ is adjusted to an intermediate voltage.

In the present embodiment, the first terminal 81 and the third terminal 83 that are positive terminals are arranged on a +X side of a center of the first substrate 21 in the X-axis direction. The second terminal 82 is arranged on a −X side of the center of the first substrate 21 in the X-axis direction.

Figure 5:
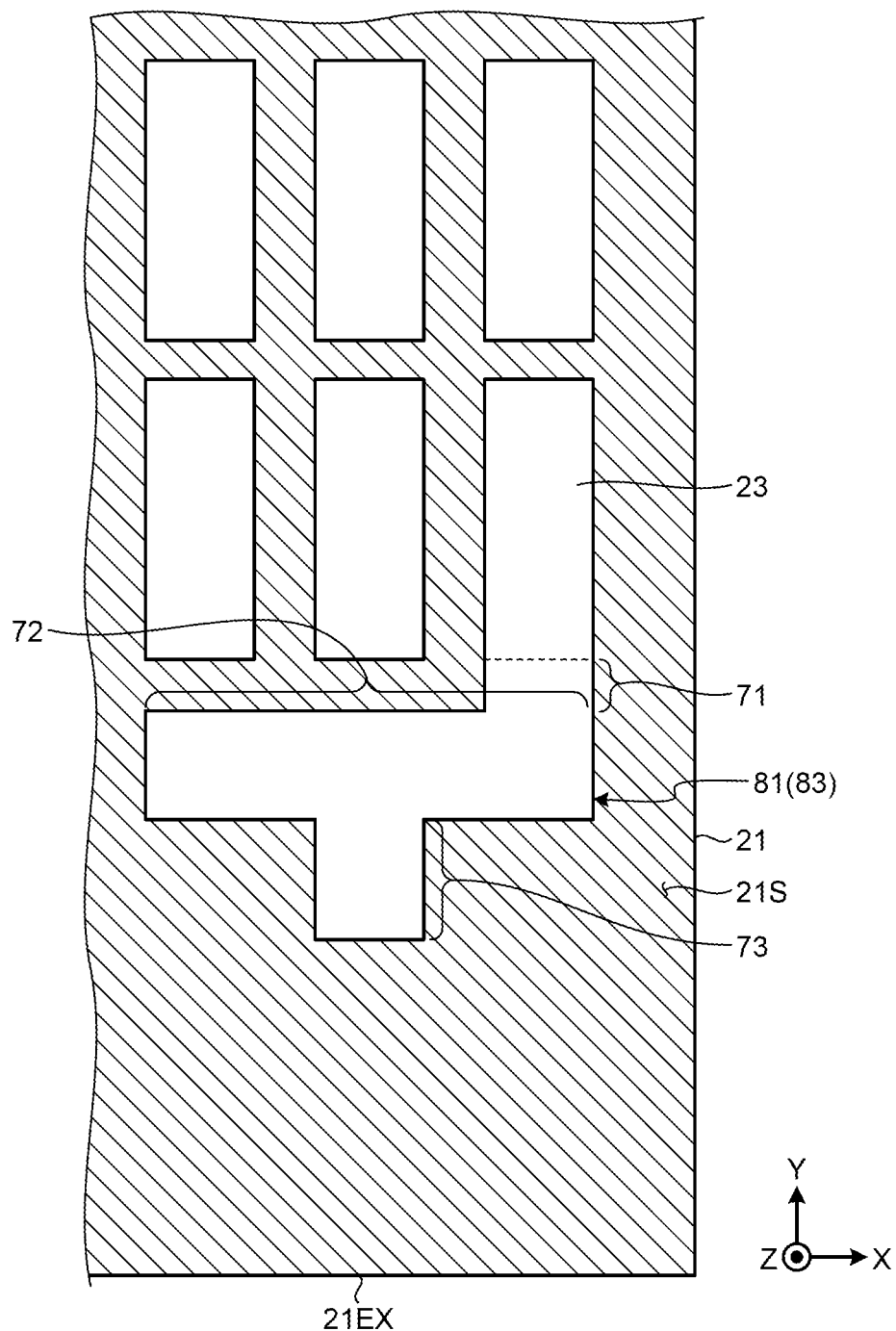
FIG. 5 is a plan view illustrating a first terminal according to the first embodiment.

FIG. 5 is a plan view illustrating the first terminal 81 according to the present embodiment. As illustrated in FIG. 5, the first terminal 81 that is a positive terminal includes a first portion 71 protruding from the electrode 23 toward a first edge portion 21EX, a second portion 72 connected to a tip portion on the −Y side of the first portion 71 and extending in the X-axis direction between the electrode 23 and the first edge portion 21EX, and a third portion 73 protruding from the second portion 72 toward the first edge portion 21EX. The second portion 72 of the first terminal 81 protrudes from the tip portion of the first portion 71 toward the center in the X-axis direction of the first substrate 21.

The third terminal 83 that is a positive terminal has a shape similar to that of the first terminal 81. That is, the third terminal 83 also includes a first portion 71 protruding from the electrode 23 toward the first edge portion 21EX, a second portion 72 connected to a tip portion on the −Y side of the first portion 71 and extending in the X-axis direction between the electrode 23 and the first edge portion 21EX, and a third portion 73 protruding from the second portion 72 toward the first edge portion 21EX. The second portion 72 of the third terminal 83 protrudes from the tip portion of the first portion 71 toward the center in the X-axis direction of the first substrate 21.

Figure 6:
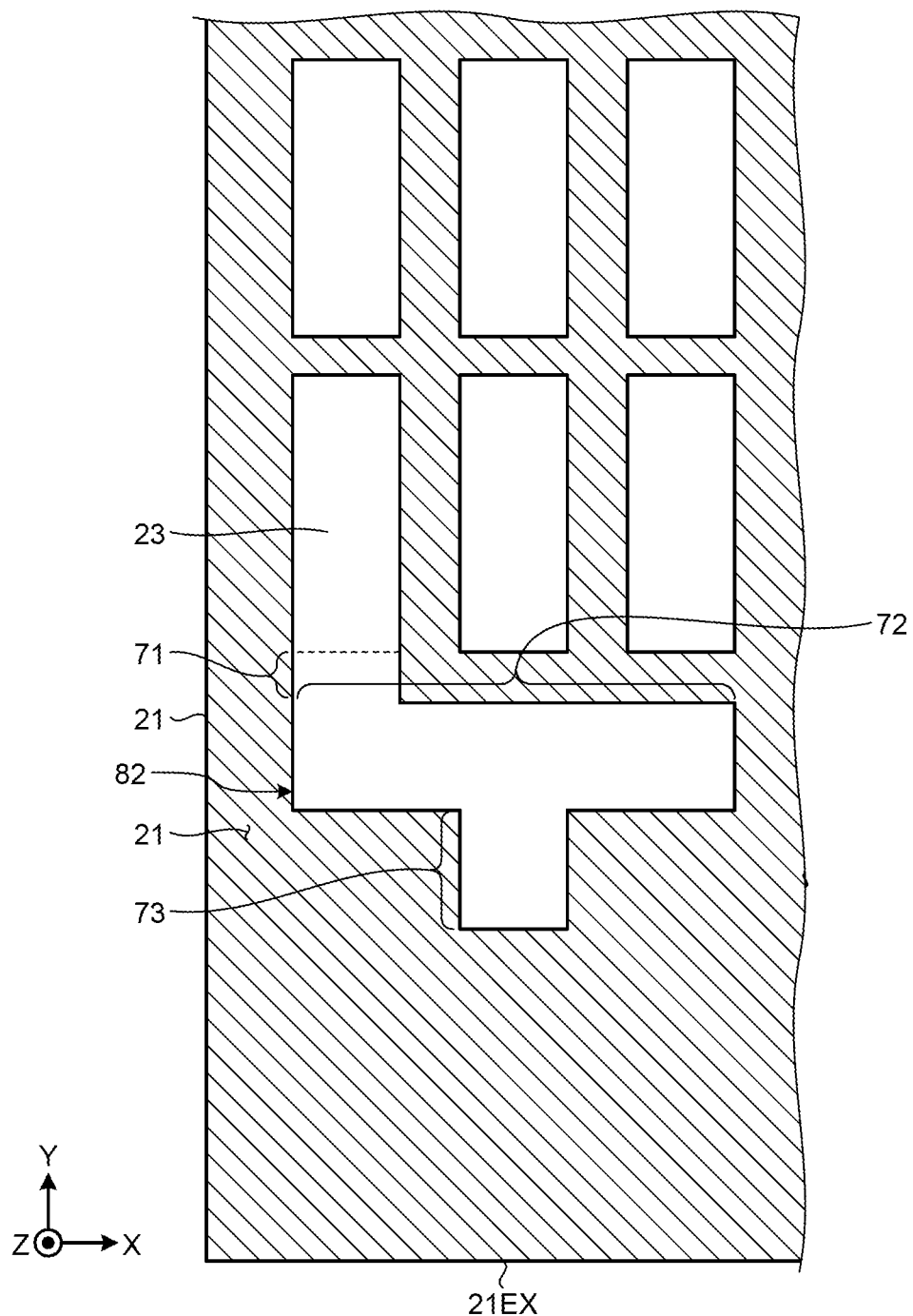
FIG. 6 is a plan view illustrating a second terminal according to the first embodiment.

FIG. 6 is a plan view illustrating the second terminal 82 according to the present embodiment. As illustrated in FIG. 6, the second terminal 82 that is a negative terminal includes a first portion 71 protruding from the electrode 23 toward the first edge portion 21EX, a second portion 72 connected to a tip portion on the −Y side of the first portion 71 and extending in the X-axis direction between the electrode 23 and the first edge portion 21EX, and a third portion 73 protruding from the second portion 72 toward the first edge portion 21EX. The second portion 72 of the second terminal 82 protrudes from the tip portion of the first portion 71 toward the center in the X-axis direction of the first substrate 21.

<Adjustment Method of Thermoelectric Module>

Next, the adjustment method the thermoelectric module 2 will be described. Note that the adjustment method described in the following is an example, and the present disclosure is not limited thereto. As described above, in the present embodiment, the electrical energy generated from the thermoelectric module 2 is distributed to the first load 7 (external load) and the second load 6 (motor). When it is assumed that power generation output indicating electrical energy generated by the thermoelectric module 2 is Pg, effective output indicating electrical energy distributed to the first load 7 is Pe, and power consumption indicating electrical energy distributed to the second load 6 is Pf, an equation (1) is satisfied.

$$P_e = P_g - P_f \quad (1)$$

In the present embodiment, adjusting the thermoelectric module 2 includes determining a voltage $V_{fan}$ that maximizes the effective output Pe. In the following description, the voltage $V_{fan}$ that maximizes the effective output Pe is arbitrarily referred to as an optimum voltage $V_{fan\_op}$. Note that the optimum voltage $V_{fan\_op}$ does not have to be the voltage $V_{fan}$ that maximizes the effective output Pe, and may be a voltage $V_{fan}$ that causes the effective output Pe to be equal to or larger than a predetermined value.

Figure 7:
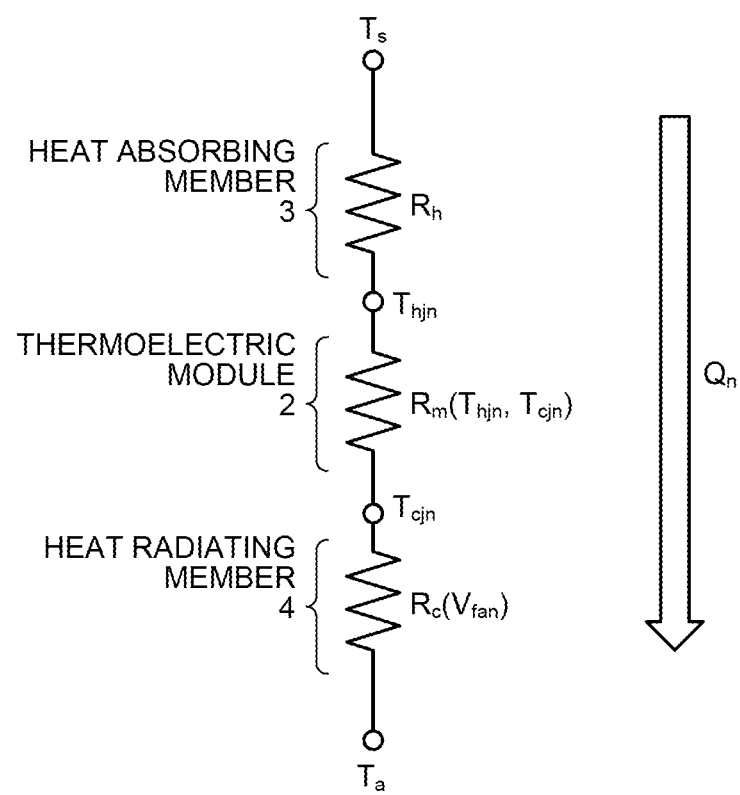
FIG. 7 is a schematic diagram illustrating thermal resistance of the thermoelectric device according to the first embodiment.

FIG. 7 is a schematic diagram illustrating thermal resistance of the thermoelectric device 1 according to the present embodiment. As illustrated in FIG. 7, the heat absorbing member 3, the thermoelectric module 2, and the heat radiating member 4 are connected in series. It is assumed that a temperature of a heat source that heats the thermoelectric module 2 is $T_s$. It is assumed that a temperature of an atmospheric space around the thermoelectric module 2 is $T_a$. It is assumed that thermal resistance of the heat absorbing member 3 is $R_h$. It is assumed that thermal resistance of the thermoelectric module 2 is $R_m$. It is assumed that thermal resistance of the heat radiating member 4 is $R_c$. It is assumed that a temperature of an end surface 21T on a high temperature side of the thermoelectric module 2 connected to the heat absorbing member 3 is $T_{hj}$. It is assumed that a temperature of an end surface 22T on a low temperature side of the thermoelectric module 2 connected to the heat radiating member 4 is $T_{cj}$. It is assumed that a penetration heat amount of the thermoelectric device 1 from the heat source including the heat absorbing member 3, the thermoelectric module 2, and the heat radiating member 4 to the atmospheric space is $Q_n$.

Figure 8:
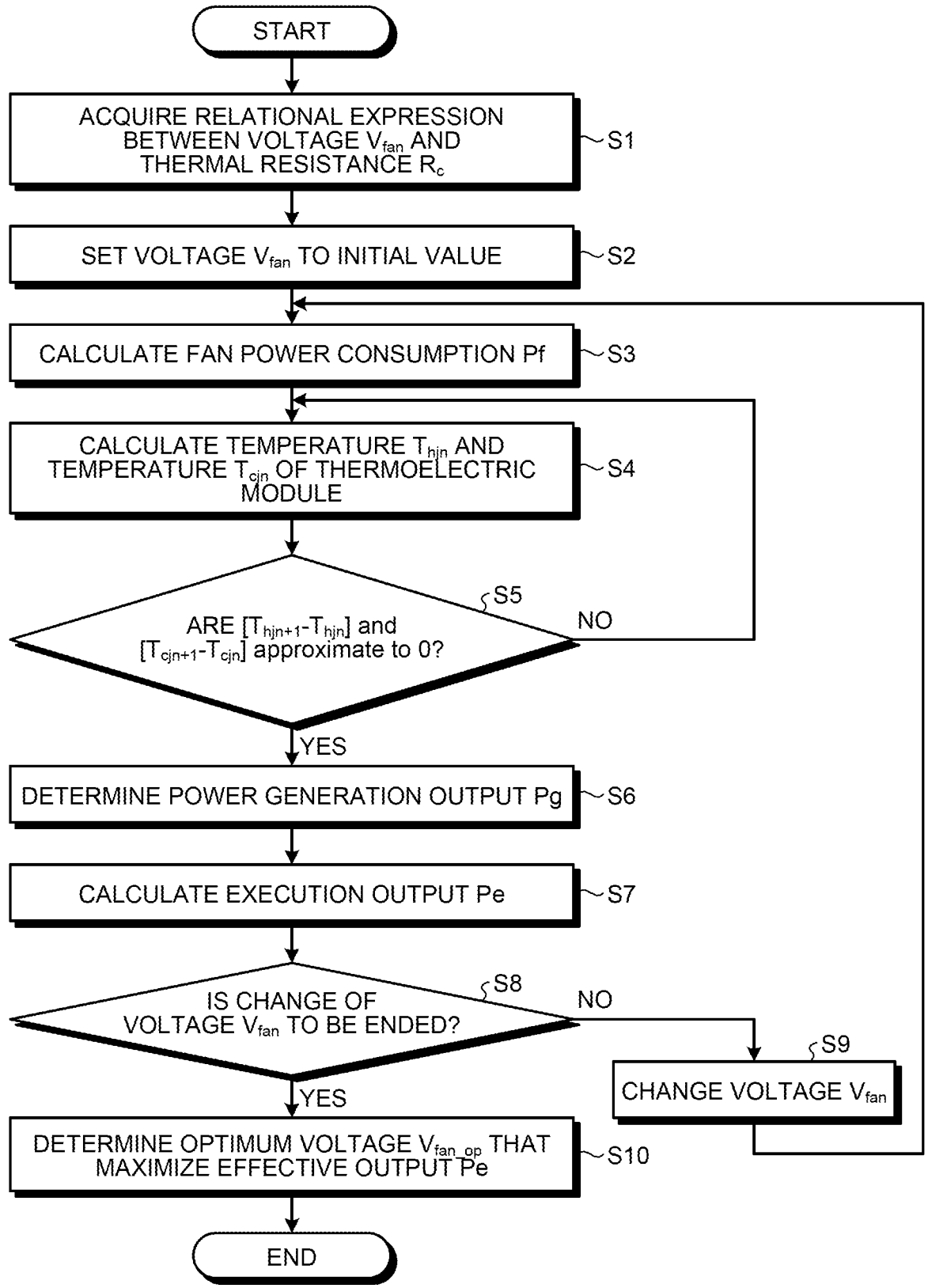
FIG. 8 is a flowchart illustrating an example of an adjustment method the thermoelectric module according to the first embodiment.

FIG. 8 is a flowchart illustrating an example of the adjustment method of the thermoelectric module 2 according to the present embodiment. The adjustment method of the thermoelectric module 2 includes a determination method of the optimum voltage $V_{fan\_op}$.

Figure 9:
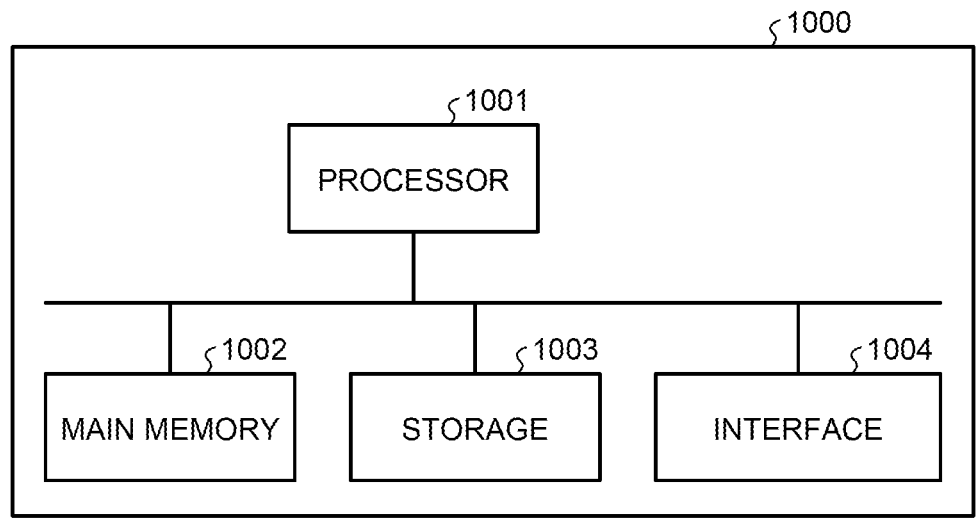
FIG. 9 is a block diagram illustrating a computer system according to the first embodiment.

FIG. 9 is a block diagram illustrating a computer system 1000 according to the present embodiment. The computer system 1000 includes a processor 1001 such as a central processing unit (CPU), a main memory 1002 including a non-volatile memory such as a read only memory (ROM) and a volatile memory such as a random access memory (RAM), a storage 1003, and an interface 1004 including an input/output circuit. The computer system 1000 determines the optimum voltage $V_{fan\_op}$. A program to determine the optimum voltage $V_{fan\_op}$ is stored in the storage 1003. The processor 1001 reads the program from the storage 1003, develops the program in the main memory 1002, and determines the optimum voltage $V_{fan\_op}$ according to the program. Note that the program may be distributed to the computer system 1000 through a network.

The processor 1001 acquires correlation data between the voltage $V_{fan}$ applied to the second load 6 and the thermal resistance $R_c$ of the heat radiating member 4 (Step S1).

In the present embodiment, the correlation data between the voltage $V_{fan}$ and the thermal resistance $R_c$ of the heat radiating member 4 includes a relational expression indicating a relationship between the voltage $V_{fan}$ and the thermal resistance $R_c$ of the heat radiating member 4.

Figure 10:
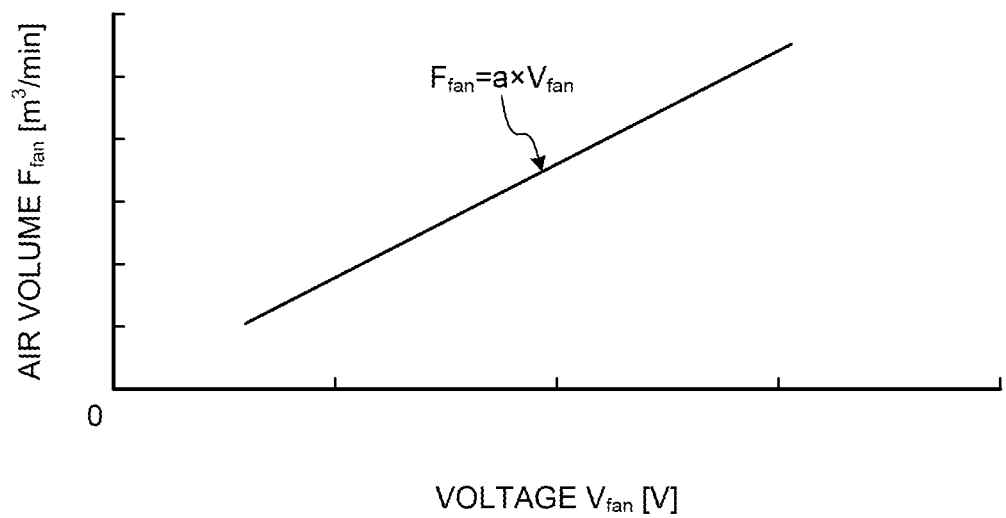
FIG. 10 is a view illustrating a relationship between a voltage applied to a motor and air volume generated by a fan according to the first embodiment.
Figure 11:
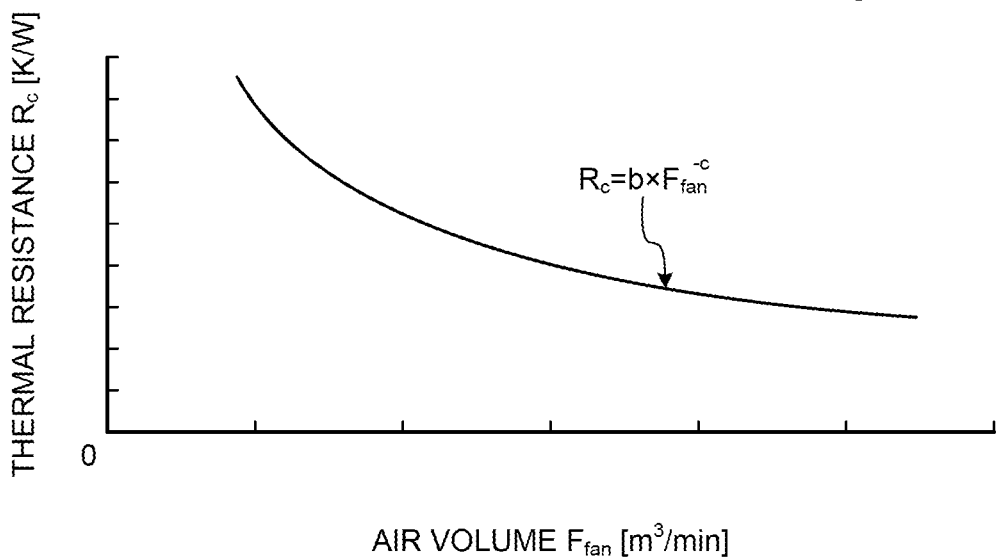
FIG. 11 is a view illustrating a relationship between air volume applied to a heat radiating member and thermal resistance of the heat radiating member according to the first embodiment.

FIG. 10 is a view illustrating a relationship between a voltage $V_{fan}$ applied to the second load 6 and air volume $F_{fan}$ generated by the fan 5 according to the present embodiment. FIG. 11 is a view illustrating a relationship between air volume $F_{fan}$ applied to the heat radiating member 4 and thermal resistance $R_c$ of the heat radiating member 4 according to the present embodiment.

In FIG. 10, a horizontal axis indicates the voltage $V_{fan}$ [V] applied to the second load 6, and a vertical axis indicates the air volume $F_{fan}$ [m³/min] generated by the fan 5 when the voltage $V_{fan}$ is applied to the second load 6. In FIG. 11, a horizontal axis indicates the air volume $F_{fan}$ applied to the heat radiating member 4, and a vertical axis indicates the thermal resistance $R_c$ [K/W] of the heat radiating member 4 of when the air volume $F_{fan}$ is applied.

An equation (2) is satisfied between the voltage $V_{fan}$ applied to the second load 6 and the air volume $F_{fan}$ generated by the fan 5 when the voltage $V_{fan}$ is applied to the second load 6. In the equation (2), a is a constant.

$$F_{fan} = a \times V_{fan} \quad (2)$$

An equation (3) is satisfied between the air volume $F_{fan}$ applied from the fan 5 to the heat radiating member 4 and the thermal resistance $R_c$ of the heat radiating member 4 of when the air volume $F_{fan}$ is applied. In the equation (3), b and c are constants.

$$R_c = b \times F_{fan}^{-c} \quad (3)$$

FIG. 10 is a graph of the equation (2). FIG. 11 is a graph of the equation (3).

Figure 12:
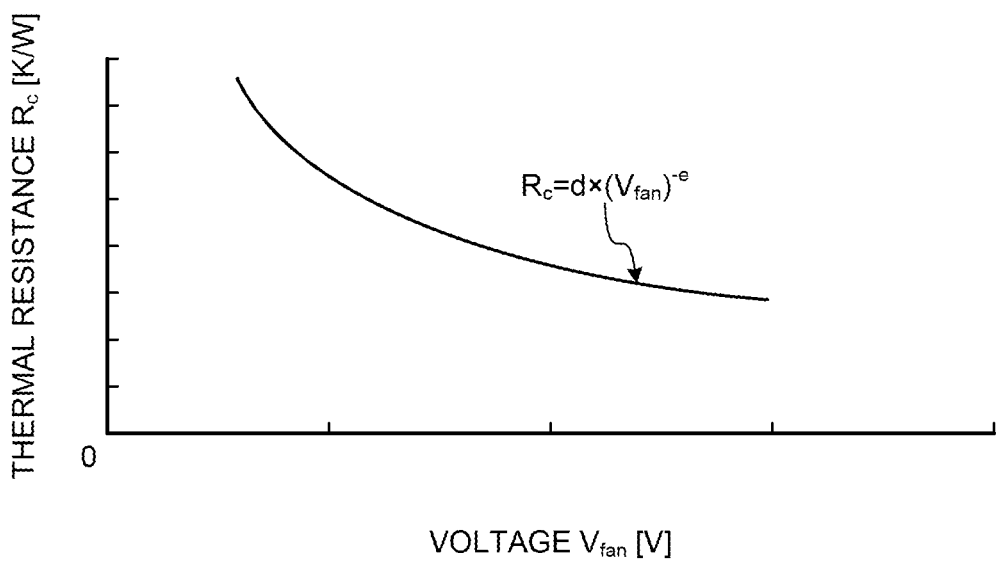
FIG. 12 is a view illustrating a relationship between the voltage applied to the motor and the thermal resistance of the heat radiating member according to the first embodiment.

FIG. 12 is a view illustrating a relationship between a voltage $V_{fan}$ applied to the second load 6 and thermal resistance $R_c$ of the heat radiating member 4 according to the present embodiment. In FIG. 12, a horizontal axis indicates the voltage $V_{fan}$ [V] applied to the second load 6, and a vertical axis indicates the thermal resistance $R_c$ [K/W] of the heat radiating member 4 of when the voltage $V_{fan}$ is applied to the second load 6. From the equation (2) and the equation (3), an equation (4) is satisfied between the voltage $V_{fan}$ applied to the second load 6 and the thermal resistance $R_c$ of the heat radiating member 4 of when the voltage $V_{fan}$ is applied to the second load 6.

$$R_c = a^{-c} \times b \times V_{fan}^{-c} \quad (4)$$

FIG. 12 is a graph of the equation (4).

Correlation data including the relational expression between the voltage $V_{fan}$ and the thermal resistance $R_c$ indicated in the equation (4) is stored in advance in the storage 1003. The processor 1001 acquires the relational expression between the voltage $V_{fan}$ and the thermal resistance $R_c$ indicated in the equation (4) from the storage 1003 as the correlation data between the voltage $V_{fan}$ and the thermal resistance $R_c$.

After acquiring the correlation data between the voltage $V_{fan}$ and the thermal resistance $R_c$, the processor 1001 sets the voltage $V_{fan}$ to an initial value (Step S2).

After the voltage $V_{fan}$ is set to the initial value, the processor 1001 calculates the power consumption Pf on the basis of the voltage $V_{fan}$ applied to the second load 6 and a current $I_{fan}$ that flows in the second load 6 when the voltage $V_{fan}$ is applied (Step S3).

A relationship between the voltage $V_{fan}$ applied to the second load 6 and the current $I_{fan}$ that flows in the second load 6 when the voltage $V_{fan}$ is applied is known data that can be derived from specification data of the second load 6, and is stored in advance in the storage 1003. Note that the relationship between the voltage $V_{fan}$ and the current $I_{fan}$ may be derived, for example, by a preliminary experiment or simulation. The processor 1001 calculates the power consumption Pf on the basis of an equation (5).

$$P_f = I_{fan} \times V_{fan} \quad (5)$$

The processor 1001 calculates a temperature $T_{hj}$ of the end surface 21T on the high temperature side and a temperature $T_{cj}$ of the end surface 22T on the low temperature side of the thermoelectric module 2 on the basis of the thermal resistance $R_h$ of the heat absorbing member 3, the thermal resistance $R_m$ of the thermoelectric module 2, the thermal resistance $R_c$ of the heat radiating member 4, the temperature $T_s$ of the heat source, and the temperature $T_a$ of the atmospheric space (Step S4).

Generally, when a temperature difference between both end surfaces of an object having thermal resistance R is ΔT, a penetration heat amount Q of the object is expressed by an equation (6).

$$Q = \frac{\Delta T}{R} \quad (6)$$

Thus, a penetration heat amount $Q_n$ of the thermoelectric device 1 is calculated on the basis of an equation (7). Also, a temperature $T_{hjn+1}$ on the high temperature side and a temperature $T_{cjn+1}$ on the low temperature side of the thermoelectric module 2 are calculated on the basis of an equation (8) and an equation (9).

$$Q_n = \frac{T_s - T_a}{R_h + R_m(T_{hjn}, T_{cjn}) + R_c} \quad (7)$$

$$T_{hjn+1} = T_s - Q_n \times R_h \quad (8)$$

$$T_{cjn+1} = T_a + Q_n \times R_c \quad (9)$$

In the equation (7) and the equation (9), the thermal resistance $R_c$ is calculated by substitution of the initial value of the voltage $V_{fan}$ set in Step S2 into the equation (4). In the equation (7), the thermal resistance $R_m$ is calculated on the basis of an equation (10) and an equation (11).

$$T_m = \frac{T_{hjn} + T_{cjn}}{2} \quad (10)$$

$$R_m = a \times T_m^3 + b \times T_m^2 + c \times T_m + d \quad (11)$$

As indicated in the equation (10), a temperature $T_m$ is an average value of the temperature $T_{hj}$ of the end surface 21T on the high temperature side and the temperature $T_{cj}$ of the end surface 22T on the low temperature side of the thermoelectric module 2. In the equation (11), each of a constant a, a constant b, a constant c, and a constant d is a unique value determined according to a material of the thermoelectric element 25. As indicated in the equation (11), the thermal resistance $R_m$ of the thermoelectric module 2 is a function of the temperature $T_m$ (temperature $T_{hj}$ and temperature $T_{cj}$).

The processor 1001 executes an operation $[T_{hjn+1} - T_{hjn}]$ and an operation $[T_{cjn+1} - T_{cjn}]$ and determines whether a value of $[T_{hjn+1} - T_{hjn}]$ and a value of $[T_{cjn+1} - T_{cjn}]$ are approximate to 0 (Step S5).

The processor 1001 determines that the value of $[T_{hjn+1} - T_{hjn}]$ is approximate to 0 in a case where a difference between the value of $[T_{hjn+1} - T_{hjn}]$ and 0 is equal to or smaller than a predetermined threshold. In a case where a difference between the value of $[T_{cjn+1} - T_{cjn}]$ and 0 is equal to or smaller than a predetermined threshold, the processor 1001 determines that the value of $[T_{cjn+1} - T_{cjn}]$ is approximate to 0.

Note that in the first operation, an initial value $T_{hj0}$ is given to the temperature $T_{hjn}$ on the high temperature side, and an initial value $T_{cj0}$ is given to the temperature $T_{cjn}$ on the low temperature side. Each of the initial value $T_{hj0}$ and the initial value $T_{cj0}$ is an arbitrary value.

In a case where it is determined in Step S5 that the value of $[T_{hjn+1} - T_{hjn}]$ and the value of $[T_{cjn+1} - T_{cjn}]$ are not approximate to 0 (Step S5: No), the processor 1001 returns to the processing in Step S4. The processor 1001 repeats the above processing until it is determined that the value of $[T_{hjn+1} - T_{hjn}]$ and the value of $[T_{cjn+1} - T_{cjn}]$ are approximate to 0.

In a case where it is determined in Step S5 that the value of $[T_{hjn+1} - T_{hjn}]$ and the value of $[T_{cjn+1} - T_{cjn}]$ are approximate to 0 (Step S5: Yes), the processor 1001 calculates power generation output Pg on the basis of the temperature $T_{hjn}$ and the temperature $T_{cjn}$ of when the value of $[T_{hjn+1} - T_{hjn}]$ and the value of $[T_{cjn+1} - T_{cjn}]$ are approximate to 0 (Step S6).

The power generation output Pg is calculated on the basis of an equation (12). In the equation (12), a constant A is a unique constant determined on the basis of a material of the thermoelectric element 25.

$$P_g = A(T_{hjn} - T_{cjn})^2 \quad (12)$$

The processor 1001 calculates effective output Pe on the basis of the power consumption Pf calculated in Step S3 and the power generation output Pg calculated in Step S7. That is, the processor 1001 calculates the effective output Pe on the basis of the equation (1) (Step S7).

From the above, the effective output Pe of when the voltage $V_{fan}$ is the initial value is calculated. The processor 1001 changes the voltage $V_{fan}$ to an arbitrary value and executes the processing from Step S3 to Step S7. That is, the processor 1001 sequentially changes the voltage $V_{fan}$, and executes the processing from Step S3 to Step S7 for each of the plurality of voltages $V_{fan}$.

The processor 1001 determines whether to end the change of the voltage $V_{fan}$ (Step S8).

In a case where it is determined in Step S8 that the change of the voltage $V_{fan}$ is not to be ended (Step S8: No), the processor 1001 executes the processing from Step S3 to Step S7 after changing the voltage $V_{fan}$ (Step S9).

Figure 13:
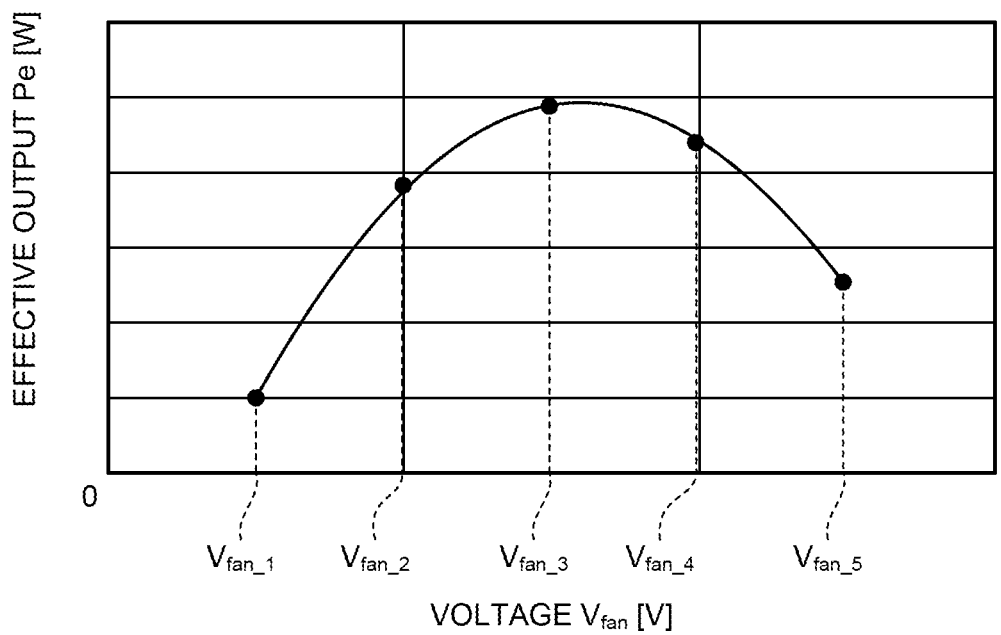
FIG. 13 is a view illustrating a relationship between the voltage applied to the motor and effective output according to the first embodiment.

FIG. 13 is a view illustrating a relationship between a voltage $V_{fan}$ applied to the second load 6 and effective output Pe according to the present embodiment. In FIG. 13, a horizontal axis indicates the voltage $V_{fan}$ applied to the second load 6, and a vertical axis indicates the effective output Pe of when the voltage $V_{fan}$ is applied to the second load 6. The processor 1001 sequentially changes the voltage $V_{fan}$, executes the processing from Step S3 to Step S7, and calculates the effective output Pe of when the voltage $V_{fan}$ is applied to the motor 10. In the example illustrated in FIG. 13, effective output Pe of when each of voltages $V_{fan\_1}$, $V_{fan\_2}$, $V_{fan\_3}$, $V_{fan\_4}$, and $V_{fan\_5}$ is applied to the second load 6 is calculated.

In a case where it is determined in Step S8 that the change of the voltage $V_{fan}$ is to be ended (Step S8: Yes), the processor 1001 determines an optimum voltage $V_{fan\_op}$ that maximizes the effective output Pe from the relationship between the voltage $V_{fan}$ and the effective output Pe illustrated in FIG. 13 (Step S9).

That is, the processor 1001 determines the optimum voltage $V_{fan\_op}$ applied to the second load 6 on the basis of a plurality of kinds of effective output Pe calculated by sequential changing of the voltage $V_{fan}$ applied to the second load 6. In the example illustrated in FIG. 13, the voltage $V_{fan\_3}$ that maximizes the effective output Pe is determined as an optimum voltage $_{fan\_op}$.

<Effect>

As described above, according to the present embodiment, at least three terminals 8 respectively connected to different electrodes 23 are provided. The terminals 8 are connected to one or both of a first load 7 and a second load 6 via lead wires. Thus, in a case where electrical energy generated from a thermoelectric module 2 is distributed to the first load 7 and the second load 6, the electrical energy can be efficiently supplied to each of the first load 7 and the second load 6.

The terminals 8 are arranged between electrodes 23 and edge portions 21E of a first substrate 21 on a surface 21S of a first substrate 21. Thus, connection between the terminals 8 and the lead wires can be smoothly executed.

The terminals 8 include a first terminal 81 connected only to the first load 7, a second terminal 82 connected to both of the first load 7 and the second load 6, and a third terminal 83 connected only to the second load 6. Thus, the electrical energy can be efficiently supplied to each of the first load 7 and the second load 6 in a state in which the number of terminals 8 is controlled.

The first substrate has first edge portions 21EX extending in the X-axis direction. The first terminal 81, the second terminal 82, and the third terminal 83 are arranged in the X-axis direction between the electrodes 23 and the first edge portions 21EX. Thus, the first terminal 81, the second terminal 82, and the third terminal 83 can be smoothly connected to a lead wire 11, a lead wire 12, and a lead wire 13, respectively.

The third terminal 83 is arranged between the first terminal 81 and the second terminal 82 in the X-axis direction. Thus, a voltage $V_{el}$ applied to the first load 7 can be made higher than a voltage $V_{fan}$ applied to the second load 6.

Each of the terminals 8 includes a first portion 71 protruding from an electrode 23 toward a first edge portion 21EX, a second portion 72 connected to a tip portion of the first portion 71 and extending in the X-axis direction between the electrode 23 and the first edge portion 21EX, and a third portion 73 protruding from the second portion 72 toward the first edge portion 21EX. In the X-axis direction, the first terminal 81 and the third terminal 83 that are positive terminals are arranged on a +X side of a center of the first substrate 21, and the second terminal 82 that is a negative terminal is arranged on a −X side of the center of the first substrate 21. The second portion 72 of each of the first terminal 81, the second terminal 82, and the third terminal 83 protrudes from the tip portion of the first portion 71 toward the center of the first substrate 21. Thus, an operator can distinguish whether a terminal 8 is a positive terminal or a negative terminal on the basis of a shape of the terminal 8. That is, the operator can visually distinguish whether the terminal 8 is a positive terminal or a negative terminal.

An optimum voltage $V_{fan\_op}$ that maximizes effective output Pe is determined on the basis of a plurality of kinds of effective output Pe calculated by sequential changing of the voltage $V_{fan}$ applied to the second load 6. Thus, the electrical energy generated from the thermoelectric module 2 can be efficiently distributed to the first load 7 and the second load 6.

Second Embodiment

The second embodiment will be described. In the following description, the same sign is assigned to a configuration element identical or equivalent to that of the above-described embodiment, and a description thereof is simplified or omitted.

Figure 14:
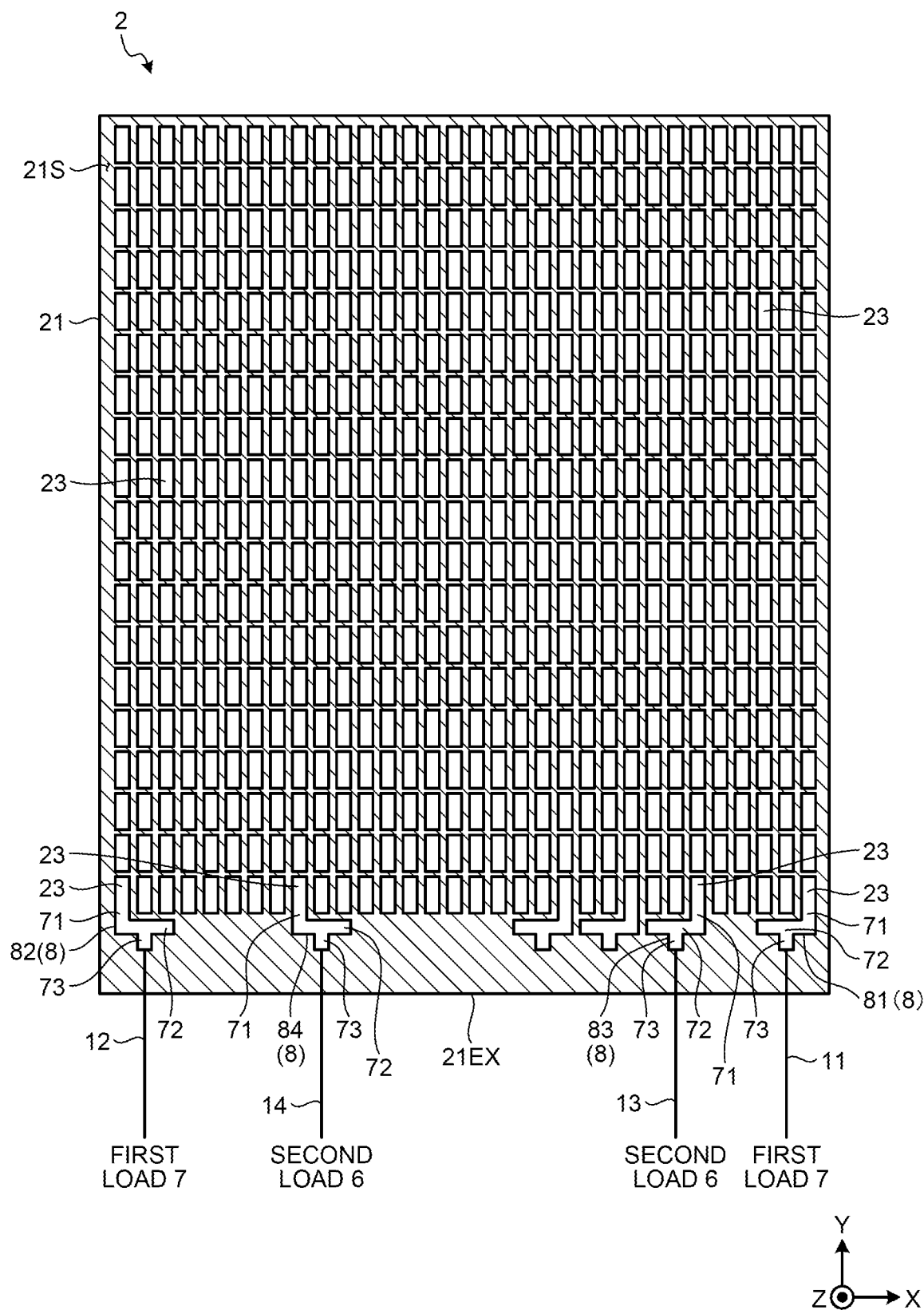
FIG. 14 is a plan view illustrating an example of a first substrate according to a second embodiment.

FIG. 14 is a plan view illustrating an example of a first substrate 21 according to the present embodiment. As illustrated in FIG. 14, terminals 8 include a first terminal 81 connected to a first load 7, a second terminal 82 connected to the first load 7, a third terminal 83 connected to a second load 6, and a fourth terminal 84 connected to the second load 6. The first terminal 81 is connected to the first load 7 via a lead wire 11. The second terminal 82 is connected to the first load 7 via a lead wire 12. The third terminal 83 is connected to the second load 6 via a lead wire 13. The fourth terminal 84 is connected to the second load 6 via a lead wire 14.

The first terminal 81 and the third terminal 83 are positive terminals. The second terminal 82 and the fourth terminal 84 are negative terminals. In an X-axis direction, the first terminal 81 and the third terminal 83 are arranged on a +X side of a center of the first substrate 21, and the second terminal 82 and the fourth terminal 84 are arranged on a −X side of the center of the first substrate 21.

Similarly to the above-described embodiment, the first substrate 21 has a first edge portion 21EX extending in the X-axis direction. The first terminal 81, the second terminal 82, the third terminal 83, and a fourth terminal 94 are arranged in the X-axis direction between electrodes 23 and the first edge portion 21EX.

The third terminal 83 and the fourth terminal 84 are arranged between the first terminal 81 and the second terminal 82 in the X-axis direction.

Each of the first terminal 81, the second terminal 82, the third terminal 83, and the fourth terminal 84 includes a first portion 71 protruding from an electrode 23 toward the first edge portion 21EX, a second portion 72 connected to a tip portion on a −Y side of the first portion 71 and extending in the X-axis direction between the electrode 23 and the first edge portion 21EX, and a third portion 73 protruding from the second portion 72 toward the first edge portion 21EX.

The second portion 72 of each of the first terminal 81, the second terminal 82, the third terminal 83, and the fourth terminal 84 protrudes from the tip portion of the first portion 71 toward the center in the X-axis direction of the first substrate 21.

As described above, in a case where electrical energy generated from a thermoelectric module 2 is distributed to the first load 7 and the second load 6, the electrical energy can be efficiently supplied to each of the first load 7 and the second load 6 also in the present embodiment.

The first substrate 21 has the first edge portion 21EX extending in the X-axis direction. The first terminal 81, the second terminal 82, the third terminal 83, and the fourth terminal 84 are arranged in the X-axis direction between the electrodes 23 and the first edge portion 21EX. Thus, the first terminal 81, the second terminal 82, the third terminal 83, and the fourth terminal 84 can be smoothly connected to the lead wire 11, the lead wire 12, the lead wire 13, and the lead wire 14, respectively.

The third terminal 83 and the fourth terminal 84 are arranged between the first terminal 81 and the second terminal 82 in the X-axis direction. That is, each of the third terminal 83 and the fourth terminal 84 is connected to an electrode 23 between an electrode 23 to which the first terminal 81 is connected and an electrode 23 to which the second terminal 82 is connected. Thus, a voltage $V_{el}$ applied to the first load 7 can be made higher than a voltage $V_{fan}$ applied to the second load 6.

Each of the terminals 8 includes a first portion 71 protruding from an electrode 23 toward the first edge portion 21EX, a second portion 72 connected to a tip portion of the first portion 71 and extending in the X-axis direction between the electrode 23 and the first edge portion 21EX, and a third portion 73 protruding from the second portion 72 toward the first edge portion 21EX. In the X-axis direction, the first terminal 81 and the third terminal 83 that are positive terminals are arranged on the +X side of the center of the first substrate 21, and the second terminal 82 and the fourth terminal 84 that are negative terminals are arranged on the −X side of the center of the first substrate 21. The second portion 72 of each of the first terminal 81, the second terminal 82, the third terminal 83, and the fourth terminal 84 protrudes from the tip portion of the first portion 71 toward the center of the first substrate 21. Thus, an operator can distinguish whether a terminal 8 is a positive terminal or a negative terminal on the basis of a shape of the terminal 8. That is, the operator can visually distinguish whether the terminal 8 is a positive terminal or a negative terminal.

Different Embodiment

Note that in the above-described embodiments, the first load 7 is an external load, and the second load 6 is a motor that rotates the fan 5. For example, both of a first load 7 and a second load 6 may be external loads arranged outside a thermoelectric device 1. Application to a form having three or more loads is also possible.

Note that in the above-described embodiments, one or both of a heat absorbing member 3 and a heat radiating member 4 may be omitted.

The invention claimed is:

1. A thermoelectric module comprising:
a substrate;
a plurality of electrodes arranged on the substrate;
a plurality of thermoelectric elements respectively connected to the plurality of electrodes, wherein the plurality of electrodes comprise (i) a first electrode that connects at least one of first surfaces of the plurality of thermoelectric elements to the substrate and (ii) a second electrode that connects second surfaces of the plurality of thermoelectric elements to one another to thereby define an electric circuit connecting the plurality of thermoelectric elements in series; and
at least three terminals that are connected to the electric circuit, that are respectively connected to different electrodes among the plurality of electrodes, and that are connected to one or both of a first load and a second load, each of the first load and the second load having a first end and a second end that are connected to at least one of the three terminals,
wherein the terminals comprise:
a first terminal disposed at a first position of the electric circuit and connected to the first end of the first load, the first terminal defining an anode of the electric circuit,
a second terminal disposed at a second position of the electric circuit and connected to the second ends of the first load and the second load, the second terminal defining a cathode of the electric circuit, and
a third terminal disposed between the anode and the cathode of the electric circuit and connected to the first end of the second load, and wherein the thermoelectric module further comprises:
a first lead wire that extends from the first terminal to the first end of the first load,
a second lead wire comprising (i) a first section that extends from the second terminal to the second end of the second load and (ii) a second section that extends from the second end of the second load and directly connects the second end of the second load to the second end of the first load, and
a third lead wire that extends from the third terminal to the first end of the second load, wherein the third lead wire is separate from the second section of the second lead wire between the second ends of the first load and the second load.

2. The thermoelectric module according to claim 1, wherein the terminals are arranged between the plurality of electrodes and an edge portion of the substrate.

3. The thermoelectric module according to claim 1, wherein the substrate has a first edge portion extending in a first axis direction, and
wherein the first terminal, the second terminal, and the third terminal are arranged in the first axis direction between the plurality of electrodes and the first edge portion.

4. The thermoelectric module according to claim 3, wherein the third terminal is arranged between the first terminal and the second terminal in the first axis direction.

5. The thermoelectric module according to claim 4, wherein each of the terminals includes a first portion protruding from one of the plurality of electrodes toward the first edge portion, a second portion connected to a tip portion of the first portion and extending in the first axis direction between the one of the plurality of electrodes and the first edge portion, and a third portion protruding from the second portion toward the first edge portion,
wherein the first terminal and the third terminal are arranged on one side of a center of the substrate and the second terminal is arranged on the other side of the center of the substrate in the first axis direction, and
wherein the second portion of each of the first terminal, the second terminal, and the third terminal protrudes from the tip portion of the first portion toward the center of the substrate.

6. The thermoelectric module according to claim 1, wherein a voltage applied to the first load is greater than a voltage applied to the second load.

7. The thermoelectric module according to claim 1, wherein the second load corresponds to power for operating a motor, and the first load corresponds to power for operating an electric device different from the motor.

8. The thermoelectric module according to claim 1, wherein the substrate is a first substrate that is in contact with the first electrode,
wherein the thermoelectric module further comprises a second substrate that is in contact with the second electrode, and
wherein the plurality of thermoelectric elements are disposed between the first substrate and the second substrate.

9. The thermoelectric module according to claim 8, wherein the first substrate is configured to be heated by a heat source and to transfer the heat to the plurality of thermoelectric elements, and
wherein each of the first lead wire, the second lead wire, and the third lead wire is directly connected to the first substrate.

10. The thermoelectric module according to claim 8, wherein the second substrate is configured to discharge heat from the plurality of thermoelectric elements to a heat radiating member, the heat radiating member comprising a heat sink including (i) a plate that is in contact with the second substrate and (ii) a plurality of fins that extend from the plate.

11. The thermoelectric module according to claim 8, wherein the first substrate is configured to supply heat to the plurality of thermoelectric elements, and the second substrate is configured to discharge heat from the plurality of thermoelectric elements, and wherein each of the first lead wire, the second lead wire, and the third lead wire is directly connected to the first substrate.

* * * * *